(12) United States Patent
Bae

(10) Patent No.: US 8,106,404 B2
(45) Date of Patent: Jan. 31, 2012

(54) SEMICONDUCTOR LIGHT EMITTING DEVICE

(75) Inventor: Jung Hyeok Bae, Gyeongsangnam-do (KR)

(73) Assignee: LG Innotek Co., Ltd., Seoul (KR)

( * ) Notice: Subject to any disclaimer, the term of this patent is extended or adjusted under 35 U.S.C. 154(b) by 147 days.

(21) Appl. No.: 12/622,174

(22) Filed: Nov. 19, 2009

(65) Prior Publication Data
US 2010/0123149 A1    May 20, 2010

(30) Foreign Application Priority Data
Nov. 20, 2008  (KR) ................ 10-2008-0115563

(51) Int. Cl.
*H01L 27/15* (2006.01)
*H01L 31/12* (2006.01)
*H01L 33/00* (2006.01)

(52) U.S. Cl. ............ 257/79; 257/88; 257/95; 257/82

(58) Field of Classification Search .......... 257/79, 257/88, 91, 78, 95, 431, 98, 82, 13, 103
See application file for complete search history.

(56) References Cited

U.S. PATENT DOCUMENTS
| | | | |
|---|---|---|---|
| 7,521,329 B2 * | 4/2009 | Kwak et al. | 438/328 |
| 2005/0067623 A1 | 3/2005 | Ha et al. | |
| 2008/0006836 A1 | 1/2008 | Lee | |
| 2008/0099776 A1 * | 5/2008 | Lee et al. | 257/98 |

FOREIGN PATENT DOCUMENTS
| | | |
|---|---|---|
| KR | 10-2005-0031720 A | 4/2005 |
| KR | 10-2006-0035424 A | 4/2006 |
| KR | 10-2006-0103619 A | 10/2006 |
| KR | 10-0809227 B1 | 2/2008 |

* cited by examiner

*Primary Examiner* — Chuong A. Luu
(74) *Attorney, Agent, or Firm* — Birch, Stewart, Kolasch & Birch, LLP

(57) ABSTRACT

Disclosed is a semiconductor light emitting device. The semiconductor light emitting device includes a plurality of compound semiconductor layers including a first conductive semiconductor layer, an active layer, and a second conductive semiconductor layer; a dot type conductive layer on the compound semiconductor layers; and an electrode layer on the dot type conductive layer.

13 Claims, 4 Drawing Sheets

US 8,106,404 B2

SEMICONDUCTOR LIGHT EMITTING DEVICE

CROSS-REFERENCE TO RELATED APPLICATIONS

The present application claims priority under 35 U.S.C. 119 and 35 U.S.C 365 to Korean Patent Application No. 10-2008-0115563 (filed on Nov. 20, 2008), which is hereby incorporated by reference in its entirety.

BACKGROUND

The embodiment relates to a semiconductor light emitting device.

Group III-V nitride semiconductors have been extensively used as main materials for light emitting devices, such as a light emitting diode (LED) or a laser diode (LD), due to the physical and chemical characteristics thereof. In general, the group III-V nitride semiconductors include semiconductor material having a composition formula of $In_xAl_yGa_{1-x-y}N$ ($0 \leq x \leq 1$, $0 \leq y \leq 1$ and $0 \leq x+y \leq 1$).

The LED is a semiconductor device which transmits/receives signals by converting an electric signal into infrared ray or light using the characteristics of compound semiconductors. The LED is also used as a light source.

The LED or the LD using such nitride semiconductor material is mainly used for the light emitting device to provide the light. For example, the LED or the LD is used as a light source for various products, such as a keypad light emitting part of a cellular phone, an electric signboard, an illumination device and the like.

SUMMARY

The embodiment provides a semiconductor light emitting device including a dot type conductive layer under a light emitting structure.

The embodiment provides a semiconductor light emitting device capable of improving hole injection efficiency by forming a super-conductive layer containing Ag between a light emitting structure and an electrode layer.

The embodiment provides a semiconductor light emitting device including a dot type super-conductive layer on a light emitting structure, and an ohmic contact layer and/or an electrode layer on the dot type super-conductive layer.

An embodiment provides a semiconductor light emitting device comprising: a plurality of compound semiconductor layers including a first conductive semiconductor layer, an active layer, and a second conductive semiconductor layer; a dot type conductive layer on the compound semiconductor layers; and an electrode layer on the dot type conductive layer.

An embodiment provides a semiconductor light emitting device comprising: a plurality of compound semiconductor layers including a first conductive semiconductor layer, an active layer, and a second conductive semiconductor layer; an electrode under the compound semiconductor layer; a dot type super-conductive layer containing Ag on the compound semiconductor layers; an ohmic contact layer on the dot type super-conductive layer; and an electrode layer on the ohmic contact layer. An embodiment provides a semiconductor light emitting device comprising: a plurality of compound semiconductor layers including a first conductive semiconductor layer, an active layer, and a second conductive semiconductor layer; an ohmic contact layer formed on the compound semiconductor layers and including a nano-sized dot containing Ag; an electrode under the compound semiconductor layers; an electrode layer on the ohmic contact layer; and a conductive support member on the electrode layer.

The details of one or more embodiments are set forth in the accompanying drawings and the description below. Other features will be apparent from the description and drawings, and from the claims.

DETAILED DESCRIPTION OF THE EMBODIMENTS

Figure 1:
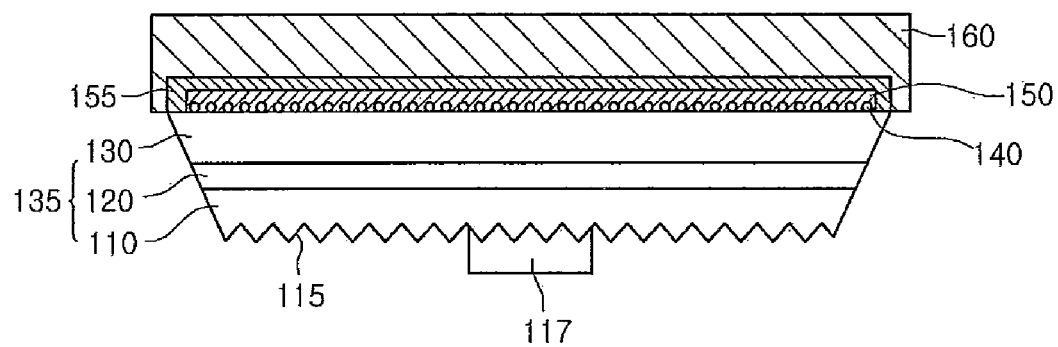
FIG. 1 is a side sectional view showing a semiconductor light emitting device according to a first embodiment.

Hereinafter, a semiconductor light emitting device according to an embodiment will be described with reference to the accompanying drawings. In the description of the embodiment, the term "on" or "under" of each layer will be described with reference to the accompanying drawings and thickness of each layer is not limited to thickness shown in the drawings.

In the description of an embodiment, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern.

Figure 2:
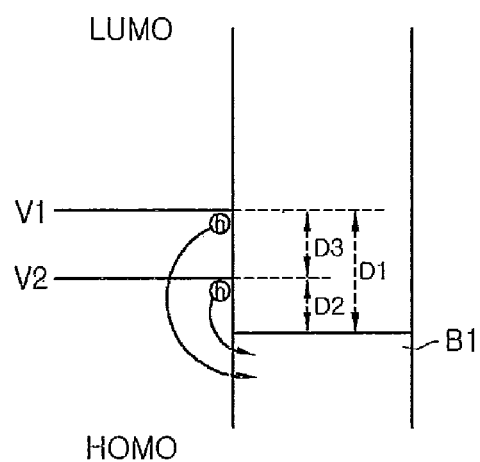
FIG. 2 is a hole injection diagram of an ohmic contact layer and a dot type conductive layer shown in FIG. 1.

FIG. 1 is a side sectional view showing a semiconductor light emitting device according to a first embodiment and FIG. 2 is a hole injection diagram of an ohmic contact layer and a dot type conductive layer shown in FIG. 1.

Referring to FIG. 1, the semiconductor light emitting device 100 includes a first conductive semiconductor layer 110, an active layer 120, a second conductive semiconductor layer 130, a dot type conductive layer 140, an ohmic contact layer 150, an electrode layer 155, a conductive support member 160 and an electrode 117.

The semiconductor light emitting device 100 includes an LED based on a plurality of compound semiconductor layers, e.g., compound semiconductor layers of III-V group elements, and the LED may include a color LED emitting blue light, green light or red light or an UV LED. The light emitted from the LED may be variously realized using various semiconductors within the technical scope of the embodiment.

The compound semiconductor layers include light emitting structure 135. The light emitting structure 135 includes the first conductive semiconductor layer 110, the active layer 120 and the second conductive semiconductor layer 130.

The first conductive semiconductor layer 110 may include one selected from the group consisting of GaN, AlN, AlGaN, InGaN, InN, InAlGaN, AlInN, AlGaAs, GaP, GaAs, GaAsP and AlGaInP, which are the compound semiconductors of the III-V group elements doped with a first conductive dopant. When the first conductive semiconductor layer 110 is an N type semiconductor layer, the first conductive dopant includes an N type dopant such as Si, Ge, Sn, Se or Te. The first conductive semiconductor layer 110 may have a single layer or a multilayer. However, the embodiment is not limited thereto.

An electrode 117 is formed under the first conductive semiconductor layer 110. The electrode 117 may have a predetermined shape and can be provided in a predetermined pattern. However, the embodiment is not limited thereto. The first conductive semiconductor layer 110 may be positioned at a center portion of a lower surface of the first conductive semiconductor layer 110 to facilitate supply of electric current.

The electrode 117 may serve as an electrode pad and may include one selected from the group consisting of Ti, Al, In, Ta, Pd, Co, Ni, Si, Ge, Ag and Au. However, the embodiment is not limited thereto.

The first conductive semiconductor layer 110 may be provided on a lower surface thereof with a roughness pattern. However, the embodiment is not limited thereto.

The active layer 120 is formed on the first conductive semiconductor layer 110 and may have a single quantum well structure or a multi-quantum well structure. The active layer 120 may have an arrangement of a well layer and a barrier layer using compound semiconductor materials of the III-V group elements. For example, the active layer 120 may have an arrangement of an InGaN well layer and a GaN barrier layer. A conductive clad layer may be formed on and/or under the active layer 120, and may include an AlGaN-based layer.

The second conductive semiconductor layer 130 is formed on the active layer 120, and may include one selected from the group consisting of GaN, AlN, AlGaN, InGaN, InN, InAlGaN, AlInN, AlGaAs, GaP, GaAs, GaAsP and AlGaInP, which are the compound semiconductors of III-V group elements doped with a second conductive dopant. When the second conductive semiconductor layer 130 is a P type semiconductor layer, the second conductive dopant includes a P type dopant such as Mg and Zn. The second conductive semiconductor layer 130 may have a single layer or a multilayer. However, the embodiment is not limited thereto.

The light emitting structure 135 may include an N type semiconductor layer or a p type semiconductor layer on the second conductive semiconductor layer 130. Further, the first conductive semiconductor layer 110 may be provided as a p type semiconductor layer and the second conductive semiconductor layer 130 may be provided as an N type semiconductor layer. The light emitting structure 135 may include at least one of an N-P junction structure, a P-N junction structure, an N-P-N junction structure and a P-N-P junction structure.

The dot type conductive layer 140 is formed on the light emitting structure 135 and the ohmic contact layer 150 is formed on the dot type conductive layer 140.

The dot type conductive layer 140 is formed on the second conductive semiconductor layer 130 to improve a work function of the second conductive semiconductor layer 130.

The dot type conductive layer 140 may include conductive material using oxide, oxide containing Ag, or super-conductive material containing Ag. For example, the dot type conductive layer 140 may include $Ag_2O$ and the like. For the purpose of convenience, the dot type conductive layer 140 will be explained as a dot layer using $Ag_2O$ material.

The dot type conductive layer 140 is an $Ag_2O$ dot layer treated with ozone and may have a work function of about 5.3 eV or less (~5.3 eV). The work function of the dot type conductive layer 140 is higher than a work function of the ohmic contact layer 150, so that efficiency of hole injection into the active layer 120 can be improved. If the hole injection efficiency is improved, light extraction efficiency in the active layer 120 can also be improved.

For example, the dot type conductive layer 140 may have a diameter of about 5 nm (nano-size) or less and the dot size may vary depending on the work function of about 5.3 eV or less and the hole injection efficiency.

The ohmic contact layer 150 is formed on the dot type conductive layer 140 and may include seed metal having ohmic characteristics. The ohmic contact layer 150 can be provided as a layer or a pattern (e.g., a matrix type). For example, the ohmic contact layer 150 may include at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au and Ni/IrOx/Au/ITO. However, the embodiment is not limited thereto.

The ohmic contact layer 150 may have a work function of about 4.8 eV or less (~4.8 eV) or may include material having a work function lower than the work function of the dot type conductive layer 140. The ohmic contact layer 150 may be omitted. The ohmic contact layer 150 may comprises the dot type conductive layer.

The electrode layer 155 is formed on the ohmic contact layer 150 or the dot type conductive layer 140. The electrode layer 155 may serve as a reflective electrode layer. For example, the electrode layer 155 may include one selected from the group consisting of Ag, Ni, Al, Rh, Pd, Ir, Ru, Mg, Zn, Pt, Au and Hf and a combination thereof.

The conductive support member 160 is formed on the electrode layer 155. The conductive support member 160 may serve as a base substrate and may include Cu, Au, Ni, Mo, Cu—W, and carrier wafer such as Si, Ge, GaAs, ZnO, SiC, SiGe, GaN-based wafer, and $Ga_2O_3$-based wafer. The conductive support member 160 may be formed through an electrolytic plating scheme or can be prepared in the form of a sheet. However, the embodiment is not limited thereto. The conductive support member 160 may have a thickness of about 30 μm to about 150 μm. However, the embodiment is not limited thereto.

Referring to FIGS. 1 and 2, the work function V1 of the ohmic contact layer 150 is about 4.8 eV or less, and the work function V2 of the dot type conductive layer 140 is about 5.3 eV or less, which is higher than the work function V1 of the ohmic contact layer 150.

When a hole injection barrier D1 of the ohmic contact layer 150 is indicated by D1 and a hole injection barrier D2 of the dot type conductive layer 140 is indicated by D2, a gap D3 (D1-D2) exists between the hole injection barrier D1 of the ohmic contact layer 150 and the hole injection barrier D2 of the dot type conductive layer 140. In such a case, the efficiency of the hole injection into a band B1 of the second conductive semiconductor layer 130 through the dot type conductive layer 140 can be improved due to the difference D3. That is, the dot type conductive layer 140 is provided on the light emitting structure 135 such that the hole injection efficiency can be improved.

A hole is transferred from the highest occupied molecular orbital (HOMO) level and an electron is transferred from the lowest unoccupied molecular orbital (LUMO) level. The work function can be defined as the energy which is required to move an electron from the Fermi level to the vacuum level such that the electron can freely move. The energy difference between the HOMO level and the LUMO level may correspond to the work function.

The HOMO level corresponds to a conduction band and refers to the highest energy level in the electron bonding orbital. The LUMO represents a vacuum level and refers to the lowest energy level in the electron non-bonding orbital.

If power having a second polarity is applied, the dot type conductive layer 140 aligned above the second conductive semiconductor layer 130 can improve the efficiency of the hole injection into the second conductive semiconductor layer 130.

FIGS. 3 to 7 are sectional views showing the procedure of manufacturing the semiconductor light emitting device shown in FIG. 1.

Figure 3:
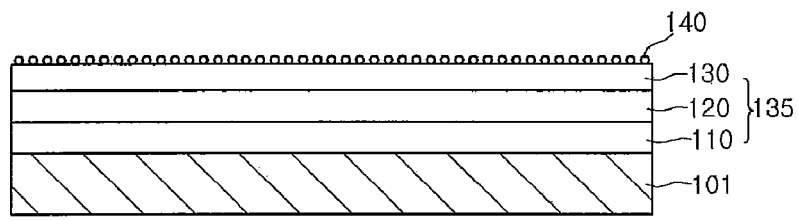
FIGS. 3 to 7 are sectional views showing the procedure of manufacturing a semiconductor light emitting device shown in FIG. 1.

Referring to FIG. 3, a substrate 101 is loaded on growing equipment and a compound semiconductor layer of II to VI group elements is formed on the substrate 101.

The growing equipment may include E-beam deposition equipment, physical vapor deposition (PVD) equipment, chemical vapor deposition (CVD) equipment, plasma laser deposition (PLD) equipment, a dual-type thermal evaporator, sputtering equipment and metal organic chemical vapor deposition (MOCVD) equipment. However, the embodiment is not limited thereto.

The substrate 101 may include one selected from the group consisting of sapphire ($Al_2O_3$), GaN, SiC, ZnO, Si, GaP, InP, $Ga_2O_3$, a conductive substrate and GaAs. The substrate 101 may be provided on the upper surface thereof with a concave-convex pattern. Further, a layer or a pattern using compound semiconductor of II to VI group elements may be formed on the substrate 101. For example, at least one of a ZnO layer (not shown), a buffer layer (not shown) and an undoped semiconductor layer (not shown) maybe formed on the substrate 101.

The buffer layer and the undoped semiconductor layer may include the compound semiconductors of the III-V group elements. The buffer layer reduces a lattice constant difference from the substrate 101, and the undoped semiconductor layer may include an undoped GaN-based semiconductor layer.

The light emitting structure 135 including the compound semiconductor layers is formed on the substrate 101. The light emitting structure 135 includes the first conductive semiconductor layer 110, the active layer 120 and the second conductive semiconductor layer 130. The first conductive semiconductor layer 110 is formed on the substrate 101 or another semiconductor layer, the active layer 120 is formed on the first conductive semiconductor layer 110, and the second conductive semiconductor layer 130 is formed on the active layer 120.

The first conductive semiconductor layer 110 may include one selected from the group consisting of GaN, AlN, AlGaN, InGaN, InN, InAlGaN, AlInN, AlGaAs, GaP, GaAs, GaAsP and AlGaInP, which are compound semiconductors of III-V group elements doped with the first conductive dopant. When the first conductive semiconductor layer 110 is the N type semiconductor layer, the first conductive dopant includes the N type dopant such as Si, Ge, Sn, Se or Te. The first conductive semiconductor layer 110 may have the single layer or the multilayer. However, the embodiment is not limited thereto.

The active layer 120 is formed on the first conductive semiconductor layer 110 and may have the single quantum well structure or the multi-quantum well structure. The active layer 120 may have an arrangement of the well layer and the barrier layer using the compound semiconductor materials of the III-V group elements. For example, the active layer 120 may have an arrangement of the InGaN well layer and the GaN barrier layer.

The conductive clad layer may be formed on and/or under the active layer 12, and may include the AlGaN-based layer.

The second conductive semiconductor layer 130 is formed on the active layer 120, and may include one selected from the group consisting of GaN, AlN, AlGaN, InGaN, InN, InAlGaN, AlInN, AlGaAs, GaP, GaAs, GaAsP and AlGaInP, which are the compound semiconductors of the III-V group elements doped with the second conductive dopant. When the second conductive semiconductor layer 130 is the P type semiconductor layer, the second conductive dopant includes the P type dopant such as Mg and Zn. The second conductive semiconductor layer 130 may have the single layer or the multilayer. However, the embodiment is not limited thereto.

Further, a third conductive semiconductor layer, e.g., an N type semiconductor layer or a p type semiconductor layer, may be formed on the second conductive semiconductor layer 130. Thus, the light emitting structure 135 may include at least one of the N-P junction structure, the P-N junction structure, the N-P-N junction structure and the P-N-P junction structure.

Further, another semiconductor layer can be formed on and/or under the first conductive semiconductor layer 110, the active layer 120 and the second conductive semiconductor layer 130. However, the embodiment is not limited thereto.

The dot type conductive layer 140 is formed on the second conductive semiconductor layer 130. In detail, the dot type conductive layer 140 may include the conductive material using oxide, the oxide containing Ag, or the super-conductive material containing Ag. For example, the dot type conductive layer 140 may include $Ag_2O$ and the like. For the purpose of convenience, the dot type conductive layer 140 will be explained as the dot layer using the $Ag_2O$ material.

Hereinafter, a process of manufacturing the $Ag_2O$ dot layer, which is the dot type conductive layer 140, will be described. First, the $Ag^+$ is deposited on the second conductive semiconductor layer 130 through a sputtering scheme. Next, the specimen is loaded into an ozone chamber and a lamp (e.g., UV lamp) irradiates light onto the specimen while supplying $O_2$ to the ozone chamber, so various species such as $O_2$, $O_3$ and oxygen ions exist in the ozone chamber. At this time, the $Ag^+$ reacts with the species such as $O_2$, $O_3$ and oxygen ions, so the $Ag^+$ exists in the form of an $Ag_2O$ dot. Thus, the Ag having a low work function of about 4.3 eV or less is changed into the $Ag_2O$ having a work function of about 5.3 eV or less.

For example, the dot type conductive layer 140 may have a diameter of about 5 nm (nano-size) or less and the dot size may vary depending on the work function of about 5.3 eV or less and the hole injection efficiency.

Figure 4:
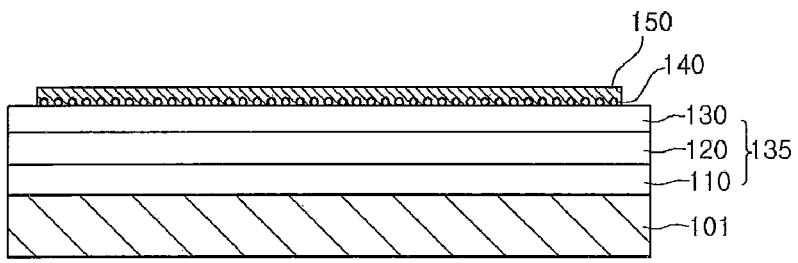

Referring to FIG. 4, the ohmic contact layer 150 is formed on the dot type conductive layer 140 and can be provided in the form of the layer or the patterns (e.g., a matrix) by using the seed metal having ohmic characteristics. A part of the ohmic contact layer 150 may be directly connected to the second conductive semiconductor layer 130.

The ohmic contact layer 150 may include at least one selected from the group consisting of ITO, IZO, IZTO, IAZO, IGZO, IGTO, AZO, ATO, GZO, IrOx, RuOx, RuOx/ITO, Ni/IrOx/Au and Ni/IrOx/Au/ITO.

The ohmic contact layer 150 may have the work function of about 4.8 eV or less (~4.8 eV) or may include the material having the work function lower than the work function of the dot type conductive layer 140. The ohmic contact layer 150 may be omitted. That is, the electrode layer 155 can be formed on the dot type conductive layer 140 without forming the ohmic contact layer 150. In such a case, the electrode layer 155 may include material having a work function lower than the work function of the dot type conductive layer 140. The work function of the ohmic contact layer 150 is about 4.8 eV or less.

Figure 5:
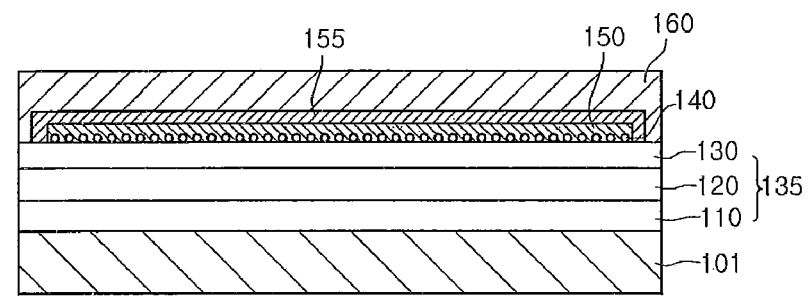

Referring to FIG. 5, the electrode layer 155 is formed on the ohmic contact layer 150 or the dot type conductive layer 140. The electrode layer 155 may serve as the reflective electrode layer. For example, the electrode layer 155 may include one selected from the group consisting of Ag, Ni, Al, Rh, Pd, Ir, Ru, Mg, Zn, Pt, Au and Hf and a combination thereof. A part of the electrode layer 155 may be directly connected to the dot type conductive layer 140 or the second conductive semiconductor layer 130.

The conductive support member 160 is formed on the electrode layer 155. The conductive support member 160 may serve as the base substrate and may include Cu, Au, Ni, Mo, Cu—W, and carrier wafer such as Si, Ge, GaAs, ZnO, SiC, SiGe, GaN-based wafer, and $Ga_2O_3$-based wafer. The conductive support member 160 may be formed through the electrolytic plating scheme or can be prepared in the form of the sheet. However, the embodiment is not limited thereto. The conductive support member 160 may have the thickness of about 30 μm to about 150 μm. However, the embodiment is not limited thereto.

Figure 6:
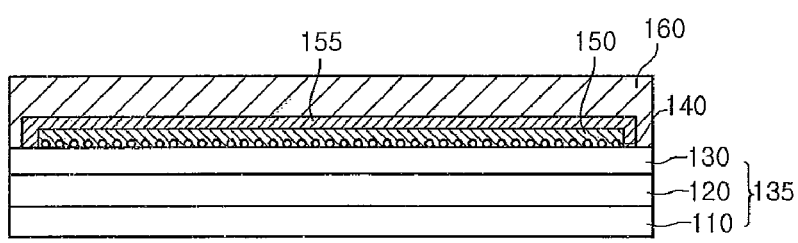

Referring to FIGS. 5 and 6, after the conductive support member 160 is disposed on a base, the substrate 101 is removed. The substrate 101 may be removed using a physical method and/or a chemical method.

According to the physical method called laser lift off (LLO), laser having a predetermined wavelength range is irradiated onto the substrate 101, so the substrate 101 is separated from the first conductive semiconductor layer 110. According to the chemical method, when another semiconductor layer (e.g., a buffer layer) is formed between the substrate 101 and the first conductive semiconductor layer 110, the buffer layer is removed using wet etch solution, so the substrate 101 is separated from the first conductive semiconductor layer 110.

After the substrate 101 is removed, the first conductive semiconductor layer 110 is subject to an etching process using inductively coupled plasma/reactive ion etching (ICP/RIE).

Figure 7:
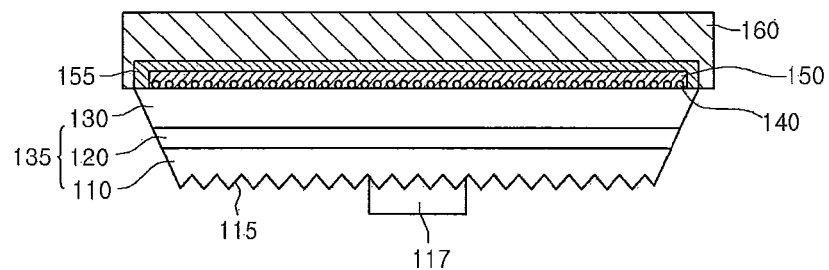

Referring to FIG. 7, after the light emitting structure 135 is partially removed by performing isolation etching relative to a boundary area (i.e. a channel area) between chips, the semiconductor light emitting device 100 is divided into a chip unit The electrode 117 is formed under the first conductive semiconductor layer 110. The electrode 117 may have a predetermined shape and can be provided as a predetermined pattern. However, the embodiment is not limited thereto. The electrode 117 may serve as an electrode pad. However, the embodiment is not limited thereto.

The first conductive semiconductor layer 110 is formed on the lower surface thereof with the roughness pattern 115. However, the embodiment is not limited thereto.

The electrode 117 and the roughness pattern 115 may be formed before or after the isolation etching process is performed, or after the chip separation process is performed. However, the embodiment is not limited thereto.

After chips are distinguished from each other through the isolation etching process, the chips are divided into individual chips through a breaking process. The roughness pattern forming process, the isolation etching process and the breaking process can be changed. However, the embodiment is not limited thereto.

According to the semiconductor light emitting device 100, the dot type conductive layer 140 is disposed between the compound semiconductor layers 110, 120 and 130 and the ohmic contact layer 150 or the electrode layer 155, so holes injected to the electrode layer 155 move by passing through the ohmic contact layer 150 and the dot type conductive layer 140. Thus, the amount of the holes injected through the dot type conductive layer 140 can be increased as compared with a structure having no dot type conductive layer 140.

Figure 8:
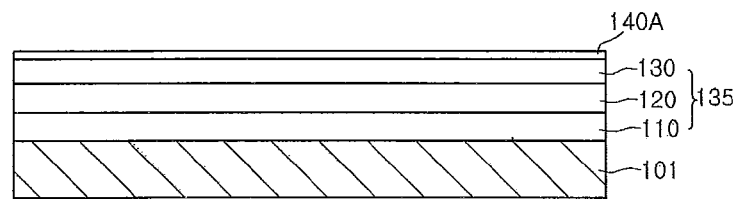
FIGS. 8 to 10 are sectional views showing the procedure of manufacturing a dot type conductive layer shown in FIG. 1.
Figure 9:
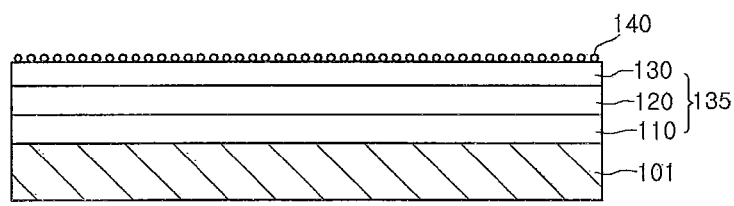
Figure 10:
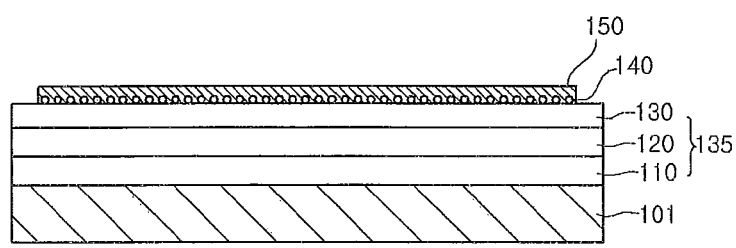

FIGS. 8 to 10 are sectional views showing the procedure of manufacturing the dot type conductive layer shown in FIG. 1.

Referring to FIGS. 8 and 9, a conductive layer 140A mixed with Ag is deposited on the surface of the second conductive semiconductor layer 130. Next, if the conductive layer 140A is subject to a thermal annealing process, a thin layer of the conductive layer 140A is removed and the Ag remains in a nanodot through agglomeration. The dot may have a diameter of about 5 nm or less.

Then, the Ag nanodot on the second conductive semiconductor layer 130 is subject to a heat treatment process. In detail, the specimen is loaded into the ozone chamber and the lamp irradiates light onto the specimen while supplying $O_2$ to the ozone chamber, so various species such as $O_2$, $O_3$ and oxygen ions exist in the ozone chamber.

At this time, the $Ag^+$ reacts with the species such as $O_2$, $O_3$ and oxygen ions, so the dot type conductive layer 140 of the $Ag_2O$ dot is formed. Thus, the Ag having the low work function of about 4.3 eV or less is changed into the $Ag_2O$ having the work function of about 5.3 eV or less.

Referring to FIG. 10, the ohmic contact layer 150 is formed on the dot type conductive layer 140 and can be provided as the layer or the pattern (e.g., matrix type). The subsequent process has been described above. The ohmic contact layer 150 is connected to the second conductive semiconductor layer 130.

Figure 11:
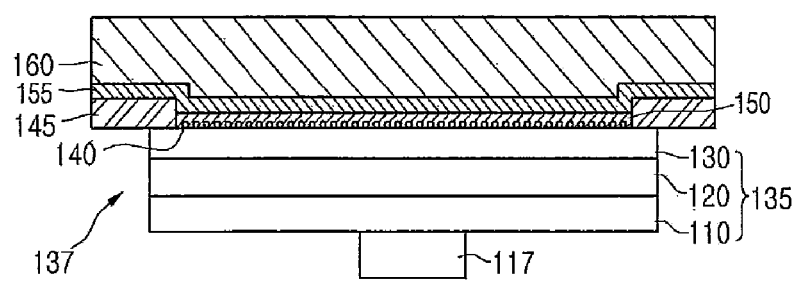
FIG. 11 is a side sectional view showing a semiconductor light emitting device according to a second embodiment.

FIG. 11 is a side sectional view showing a semiconductor light emitting device according to a second embodiment. In the second embodiment, the same reference numerals will be assigned to the same elements of the first embodiment and detailed description thereof will be omitted in order to avoid redundancy.

Referring to FIG. 11, the semiconductor light emitting device 100A includes a first conductive semiconductor layer 110, an active layer 120, a second conductive semiconductor layer 130, a dot type conductive layer 140, a channel layer 145, an ohmic contact layer 150, an electrode layer 155, a conductive support member 160 and an electrode 117.

The channel layer 145 is formed along a peripheral portion of an upper surface of the second conductive semiconductor layer 130, and an outer side of the channel layer 145 is exposed to an exterior of the light emitting structure 135. The channel layer 145 is disposed on the channel area 137 of the LED chip.

The channel layer 145 is formed along an outer peripheral portion between the second conductive semiconductor layer 130 and the electrode layer 155, and may have a ring shape, a band shape or a frame shape. Further, the channel layer 145 can be provided in a continuous pattern such as a closed loop.

The dot type conductive layer 140 is formed on an upper inner region of the second conductive semiconductor layer 130, and the channel layer 145 is formed on an outer region of the second conductive semiconductor layer 130.

The channel layer 145 may include transmittive insulating material or transmittive conductive material. For example, the channel layer 145 may include at least one selected from the group consisting of $SiO_2$, $SiO_x$, $SiO_xN_y$, $Si_3N_4$, $Al_2O_3$, $TiO_2$, ITO, IZO, IZTO, IAZO, IGZO, IGTO, AZO, ATO, GZO, IrOx, RuOx, RuOx/ITO, Ni/IrOx/Au and Ni/IrOx/Au/ITO. The channel layer 145 is formed in a transmittive insulating layer or a transmittive conductive layer In addition to the above material, the channel layer 145 may include material, which allows laser to pass therethrough, or material which generates no fragments when laser passes therethrough. Further, the channel layer 145 may include material capable of enhancing adhesive force with the second conductive semiconductor layer 130. The channel layer 145 may have a width or thickness of about 2 μm or less. However, the embodiment is not limited thereto.

According to the above configuration, an interval between the electrode layer 155 and the second conductive semiconductor layer 130 can be increased due to the channel layer 145.

Laser irradiated during the manufacturing process passes through the channel layer 145, so that lateral delamination of the light emitting structure can be prevented. Further, the channel layer 145 can prevent metal fragments, which are generated from the electrode layer 155 or the conductive support member 160, from moving toward outer sides of the semiconductor layers 110, 120 and 130. Furthermore, the channel layer 145 can prevent moisture from infiltrating into the outer sides of the semiconductor layers 110, 120 and 130.

Figure 12:
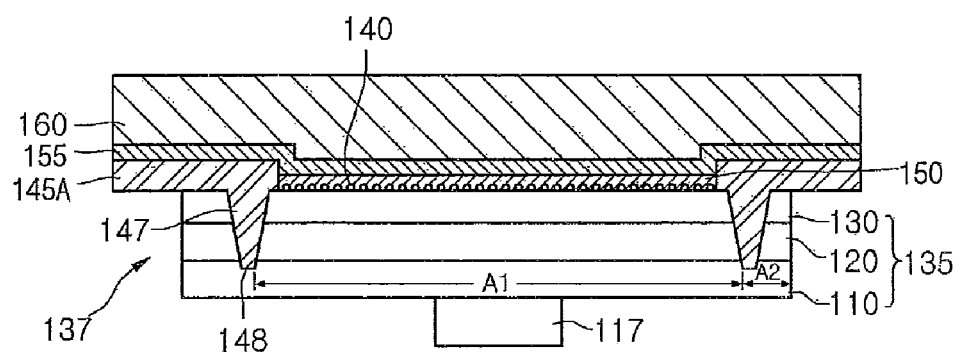
FIG. 12 is a side sectional view showing a semiconductor light emitting device according to a third embodiment.

FIG. 12 is a side sectional view showing a semiconductor light emitting device according to a third embodiment. In the third embodiment, the same reference numerals will be assigned to the same elements of the first and second embodiments and detailed description thereof will be omitted in order to avoid redundancy.

Referring to FIG. 12, the semiconductor light emitting device 100B includes a first conductive semiconductor layer 110, an active layer 120, a second conductive semiconductor layer 130, a dot type conductive layer 140, a channel layer 145A, an ohmic contact layer 150, an electrode layer 155, a conductive support member 160 and an electrode 117.

The channel layer 145A is formed along a peripheral portion of an upper surface of the second conductive semiconductor layer 130, and an outer side of the channel layer 145A is exposed to an exterior of the light emitting structure 135.

The channel layer 145A is formed along an outer peripheral portion between the second conductive semiconductor layer 130 and the electrode layer 155, and may have a ring shape, a band shape or a frame shape. Further, the channel layer 145A can be provided in a continuous pattern such as a closed loop.

The dot type conductive layer 140 is formed on an upper inner region of the second conductive semiconductor layer 130, and the channel layer 145A is formed on an outer region of the second conductive semiconductor layer 130.

For example, the channel layer 145A may include at least one selected from the group consisting of $SiO_2$, $SiO_x$, $SiO_xN_y$, $Si_3N_4$, $Al_2O_3$ and $TiO_2$. The channel layer 145A is formed in a transmittive insulating layer.

In addition to the above material, the channel layer 145A may include material, which allows laser to pass therethrough, or material which generates no fragments when laser passes therethrough. Further, the channel layer 145A may include material capable of enhancing adhesive force with the second conductive semiconductor layer 130. The channel layer 145A may have a width or thickness of about 2 μm or less. However, the embodiment is not limited thereto.

According to the above configuration, an interval between the electrode layer 155 and the second conductive semiconductor layer 130 can be increased due to the channel layer 145A.

Laser irradiated during the manufacturing process passes through the channel layer 145A, so that lateral delamination of the light emitting structure can be prevented. Further, the channel layer 145A can prevent metal fragments, which are generated from the electrode layer 155 or the conductive support member 160, from moving toward outer sides of the semiconductor layers 110, 120 and 130. Furthermore, the channel layer 145A can prevent moisture from infiltrating into the outer sides of the semiconductor layers 110, 120 and 130.

Protrusions 147 protrude downward from the bottom of the channel layer 145A. The protrusions 147 extends from the top surface of the second conductive semiconductor layer 130 to the first conductive semiconductor layer 110, so the first conductive semiconductor layer 110 is exposed through the protrusions 147. Lower ends 148 of the protrusions 147 make contact with the first conductive semiconductor layer 110.

The protrusions 147 of the channel layer 145A may have a band shape or a ring shape and can be provided in a continuous pattern. The protrusions 147 may be formed in a region which is remote from outer walls of the semiconductor layers 110, 120 and 130 within a range of about 1 μm to about 5 μm. The range of the protrusions 147 may vary depending on the size of a chip.

The protrusions 147 of the channel layer 145A can divide the light emitting structure 135 into an active area A1 and an inactive area A2. The semiconductor layers 110, 120 and 130 on the active area A1 normally operates and the semiconductor layers 110, 120 and 130 on the inactive area A2 do not normally operate.

An outer peripheral portion of the light emitting structure 135 is inactivated due to the protrusions 147 of the channel layer 145A, so that the active area A1 normally operates even if short-circuit occurs in the outer peripheral portions of the semiconductor layers 110, 120 and 130. Further, the protrusions 147 of the channel layer 145A can prevent moisture from infiltrating into an outer side of the chip. The protrusions 147 of the channel layer 145A can be formed with a single configuration or a double configuration with a concave-convex section, thereby enhancing adhesive force with the light emitting structure 135.

The features of the first to third embodiments can be selectively applied to other embodiments. This can be modified within the technical scope of the embodiments Further, the feature of the dot type conductive layer described in the above embodiments can be applied to a lateral semiconductor light emitting device as well as a vertical semiconductor light emitting device.

An embodiment provides a method for manufacturing a semiconductor light emitting device that comprises forming a light emitting structure including a first conductive semiconductor layer, an active layer and a second conductive semiconductor layer; forming a dot type conductive layer under the light emitting structure; and forming an electrode layer under the dot type conductive layer.

The embodiment can improve a work function under the light emitting structure.

The embodiment can improve the efficiency of hole injection into the light emitting structure.

The embodiment can improve the light efficiency of a vertical semiconductor light emitting device.

The embodiment can improve adhesive force between a semiconductor layer and another layer.

The embodiment can prevent interlayer short-circuit between a plurality of compound semiconductor layers.

The embodiment can prevent short-circuit between a plurality of compound semiconductor layers, which is caused by moisture infiltration.

The embodiment can improve reliability of a vertical semiconductor light emitting device.

The embodiment can provide a semiconductor light emitting device such as an LED.

The embodiment can improve electrical reliability of the semiconductor light emitting device.

The embodiment can improve light efficiency of the semiconductor light emitting device.

According to the embodiments, a light source packaged with the semiconductor light emitting device can be employed in the fields of illumination, indication, display and the like.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
    a light emitting structure including a first conductive type semiconductor layer, an active layer and a second conductive type semiconductor layer;
    a dot-type conductive layer including dots spaced apart from each other under the light emitting structure;
    an ohmic contact layer under the light emitting structure; and
    an electrode layer under the ohmic contact layer;
    wherein the dot-type conductive layer contacts the light emitting structure, the ohmic contact layer covers the dot-type conductive layer and contacts the light emitting structure at the region without the dots of the dot-type conductive layer.

2. The semiconductor light emitting device of claim 1, wherein the dot-type conductive layer includes $Ag_2O$ material of a nano-size.

3. The semiconductor light emitting device of claim 1, wherein the dot diameter of the dot-type conductive layer is less than 5 nm.

4. The semiconductor light emitting device of claim 1, wherein each dot diameter of the dot-type conductive layer is a nano-size.

5. The semiconductor light emitting device of claim 1, wherein the dot-type conductive layer is composed of $Ag_2O$ material treated with an ozone and a work function of $Ag_2O$ is equal or less than 5.3 eV.

6. The semiconductor light emitting device of claim 1, wherein the ohmic contact layer is formed of a mesh-type.

7. The semiconductor light emitting device of claim 1, further comprising an electrode on the first conductive type semiconductor layer; and
    a conductive support member disposed under the electrode layer,
    wherein the first conductive type semiconductor layer is disposed on the active layer; the second conductive type semiconductor layer is disposed under the active layer; and the ohmic contact layer contacts under the dot-type conductive layer and the second conductive type semiconductor layer.

8. The semiconductor light emitting device of claim 1, further comprising a protective layer formed in a frame shape between the electrode layer and the light emitting structure, the protective layer being disposed on the periphery thereof, wherein the protective layer includes at least one selected from the group consisting of $SiO_2$, $Si_3N_4$, $Al_2O_3$, $TiO_2$, $SiO_x$, ITO, IZO and AZO.

9. The semiconductor light emitting device of claim 1, further comprising a protective layer formed in a frame shape between the electrode layer and the light emitting structure, the protective layer being disposed on the periphery thereof; and
    a separated projection projected in a band shaped from the protective layer to a portion of the first conductive type semiconductor layer,
    wherein the protective layer is formed of a transmissive insulation material.

10. The semiconductor light emitting device of claim 2, wherein the dot diameter of the dot-type conductive layer is less than 5 nm.

11. The semiconductor light emitting device of claim 2, wherein each dot diameter of the dot-type conductive layer is a nano-size.

12. The semiconductor light emitting device of claim 2, wherein the dot-type conductive layer is composed of $Ag_2O$ material treated with an ozone and a work function of $Ag_2O$ is equal or less than 5.3 eV.

13. The semiconductor light emitting device of claim 2, wherein the ohmic contact layer is formed of a mesh-type.

* * * * *